US010020216B1

United States Patent
Fujimori et al.

(10) Patent No.: US 10,020,216 B1
(45) Date of Patent: Jul. 10, 2018

(54) ROBOT DIAGNOSING METHOD

(71) Applicants: KAWASAKI JUKOGYO KABUSHIKI KAISHA, Kobe-shi, Hyogo (JP); KAWASAKI ROBOTICS (USA), INC., Wixom, MI (US)

(72) Inventors: Kazuo Fujimori, Akashi (JP); Avish Ashok Bharwani, Santa Clara, CA (US); Hajime Nakahara, San Jose, CA (US); Ming Zeng, San Jose, CA (US); Tomokazu Arita, San Jose, CA (US)

(73) Assignees: KAWASAKI JUKOGYO KABUSHIKI KAISHA, Kobe-Shi (JP); KAWASAKI ROBOTICS (USA), INC., Wixom, MI (US)

( * ) Notice: Subject to any disclaimer, the term of this patent is extended or adjusted under 35 U.S.C. 154(b) by 0 days.

(21) Appl. No.: 15/699,380

(22) Filed: Sep. 8, 2017

(51) Int. Cl.
*G01B 11/14* (2006.01)
*H01L 21/677* (2006.01)
*B65G 49/07* (2006.01)
*B25J 9/10* (2006.01)

(52) U.S. Cl.
CPC .......... *H01L 21/67742* (2013.01); *B25J 9/10* (2013.01); *B65G 49/07* (2013.01); *G01B 11/14* (2013.01)

(58) Field of Classification Search
CPC ............ G01B 11/2425; G01B 11/2433; G01B 11/245; G01B 11/00; G01B 11/002; G01B 11/08; G01B 11/026; G01B 11/028; G01B 11/14; G01B 11/254
See application file for complete search history.

(56) References Cited

U.S. PATENT DOCUMENTS

| 4,788,440 | A  | * | 11/1988 | Pryor  | A01B 69/008 250/559.33 |
| 6,161,055 | A  | * | 12/2000 | Pryor  | G05B 19/4065 382/152 |
| 6,163,946 | A  | * | 12/2000 | Pryor  | A01B 69/008 29/407.04 |
| 2002/0068992 | A1 | * | 6/2002 | Hine   | H01L 21/67259 700/229 |
| 2003/0042440 | A1 | * | 3/2003 | Boillot | G01V 8/22 250/559.29 |
| 2011/0270443 | A1 | * | 11/2011 | Kamiya | G05B 19/401 700/245 |

(Continued)

FOREIGN PATENT DOCUMENTS

JP  2009-049251 A  3/2009

*Primary Examiner* — Michael P Stafira
(74) *Attorney, Agent, or Firm* — Oliff PLC (57) ABSTRACT

A robot diagnosing method of detecting a deviation amount caused by a lost motion includes: a first step of preparing a robot and a line sensor, the robot including a robot arm including one or a plurality of joint portions including a first joint portion, the line sensor including a detecting portion configured to detect a position of a detected portion based on a light receiving state of a light receiver, the detected portion being inserted between a light emitter and the light receiver; and a sixth step of detecting the deviation amount caused by the lost motion at the first joint portion based on (i) the position of the detected portion based on the position of the detected portion detected in a third step and a command value from a robot control portion in a fourth step and (ii) the position of the detected portion detected in a fifth step.

7 Claims, 5 Drawing Sheets

(56) References Cited

U.S. PATENT DOCUMENTS

| | | | |
|---|---|---|---|
| 2015/0330760 A1* | 11/2015 | Siercks | G01B 7/008 33/503 |
| 2017/0234681 A1* | 8/2017 | Held | G01B 21/045 324/207.12 |

* cited by examiner

ROBOT DIAGNOSING METHOD

FIELD OF THE INVENTION

The present invention relates to a robot diagnosing method, and particularly to a robot diagnosing method of detecting a deviation amount caused by a lost motion.

DESCRIPTION OF THE RELATED ART

A robot diagnosing method of detecting a deviation amount caused by a lost motion has been known. Such diagnosing method is used for a wafer conveying apparatus described in the specification of Japanese Laid-Open Patent Application Publication No. 2009-49251.

The wafer conveying apparatus of the above publication repeatedly performs an operation of detecting a wafer at target positions that are arbitrary positions offset from a teaching command position, until the wafer moves out of a detection range of a wafer edge position detection sensor. Then, the wafer conveying apparatus stores the generated target positions and positions to which a transfer arm is actually moved. After all information pieces regarding X-direction and Y-direction positions from the teaching command position are collected, an arm drive control portion produces a correction table based on position errors that are differences between the target positions of the offset operations and the positions to which the transfer arm is actually moved and which are determined based on results of center positions of the wafer.

SUMMARY OF THE INVENTION

According to the above publication, the above-described complex procedure needs to be performed to detect the deviation amount caused by the lost motion. Therefore, there is a problem that the detection of the deviation amount requires labor and time.

An object of the present invention is to provide a robot diagnosing method capable of detecting, by a simple procedure, a deviation amount caused by a lost motion.

To solve the above problems, a robot diagnosing method according to the present invention is a robot diagnosing method of detecting a deviation amount caused by a lost motion, the robot diagnosing method including: a first step of preparing a robot and a line sensor, the robot including a robot arm including one or a plurality of joint portions including a first joint portion, an end effector attached to the robot arm, and a robot control portion configured to control the robot arm and the end effector, the line sensor including a light emitter configured to emit a light ray, a light receiver configured to receive the light ray emitted from the light emitter, and a detecting portion configured to detect a position of a detected portion based on a light receiving state of the light receiver, the detected portion being inserted between the light emitter and the light receiver; a second step of inserting the detected portion of the end effector between the light emitter and the light receiver; a third step of, after the second step is performed, detecting the position of the detected portion by the line sensor; a fourth step of, after the third step is performed, rotating the first joint portion in a first direction by a predetermined angle based on a command value from the robot control portion while maintaining a state where the detected portion is being inserted between the light emitter and the light receiver; a fifth step of, after the fourth step is performed, detecting the position of the detected portion again by the line sensor; and a sixth step of detecting the deviation amount caused by the lost motion at the first joint portion based on (i) the position of the detected portion based on the position of the detected portion detected in the third step and the command value from the robot control portion in the fourth step and (ii) the position of the detected portion detected in the fifth step.

According to the above configuration, the deviation amount caused by the lost motion at the first joint portion can be detected based on (i) the position of the detected portion based on the position of the detected portion detected in the third step and the command value from the robot control portion in the fourth step and (ii) the position of the detected portion detected in the fifth step. As a result, the deviation amount caused by the lost motion can be detected by a simple procedure.

The first direction in which the first joint portion rotates in the fourth step may be opposite to a direction in which the first joint portion rotates immediately before detecting the detected portion in the third step.

According to the above configuration, the deviation amount caused by the lost motion can be accurately detected.

For example, the light ray emitted from the light emitter may have a band shape.

For example, the light emitter may emit the light ray in an upward/downward direction.

The robot may be a semiconductor manufacturing robot configured to perform an operation in a clean room that is a semiconductor manufacturing site, and in the first step, the robot and the line sensor may be prepared in the clean room.

According to the above configuration, the deviation amount caused by the lost motion can be detected without taking outside the robot configured to perform operations in the clean room that is the semiconductor manufacturing site. With this, it becomes unnecessary to perform, for example, a cleaning operation of the robot, the cleaning operation being necessary when the robot is taken outside the clean room, the deviation amount is detected, and the robot is then returned to the clean room. As a result, the effects of the present invention can be made significant in the clean room that is the semiconductor manufacturing site.

The line sensor may be included in a prealigner configured to detect a center position of a work subjected to the operation of the robot in the clean room.

According to the above configuration, the deviation amount caused by the lost motion can be detected by using the prealigner provided in advance in the clean room that is the semiconductor manufacturing site. With this, for example, an introduction cost and an installation space can be reduced.

For example, the work may be a semiconductor wafer.

DETAILED DESCRIPTION OF THE PREFERRED EMBODIMENTS

Hereinafter, an embodiment of the present invention will be explained in reference to the attached drawings. In the following explanations and drawings, the same reference signs are used for the same or corresponding components, and a repetition of the same explanation is avoided. A robot diagnosing method according to the embodiment of the present invention will be explained based on FIGS. 1 to 4.

Figure 1:
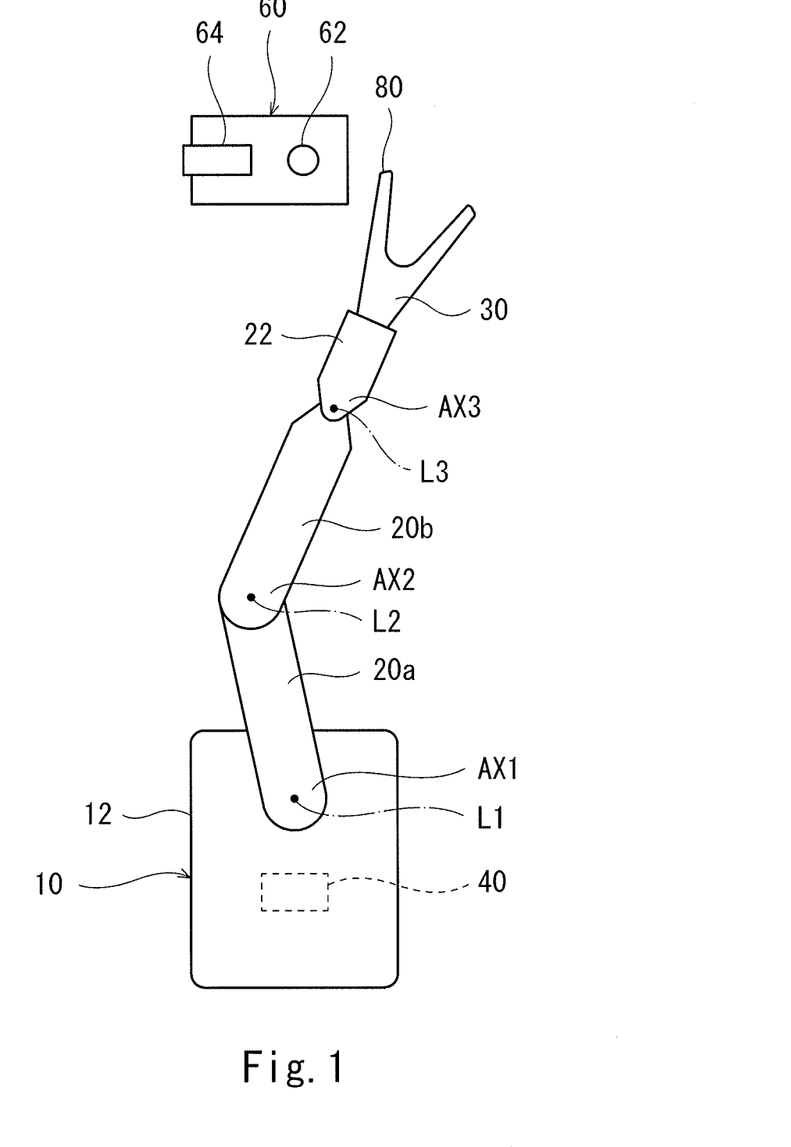
FIG. 1 is a schematic diagram for explaining a first step of a robot diagnosing method according to an embodiment of the present invention.
Figure 2:
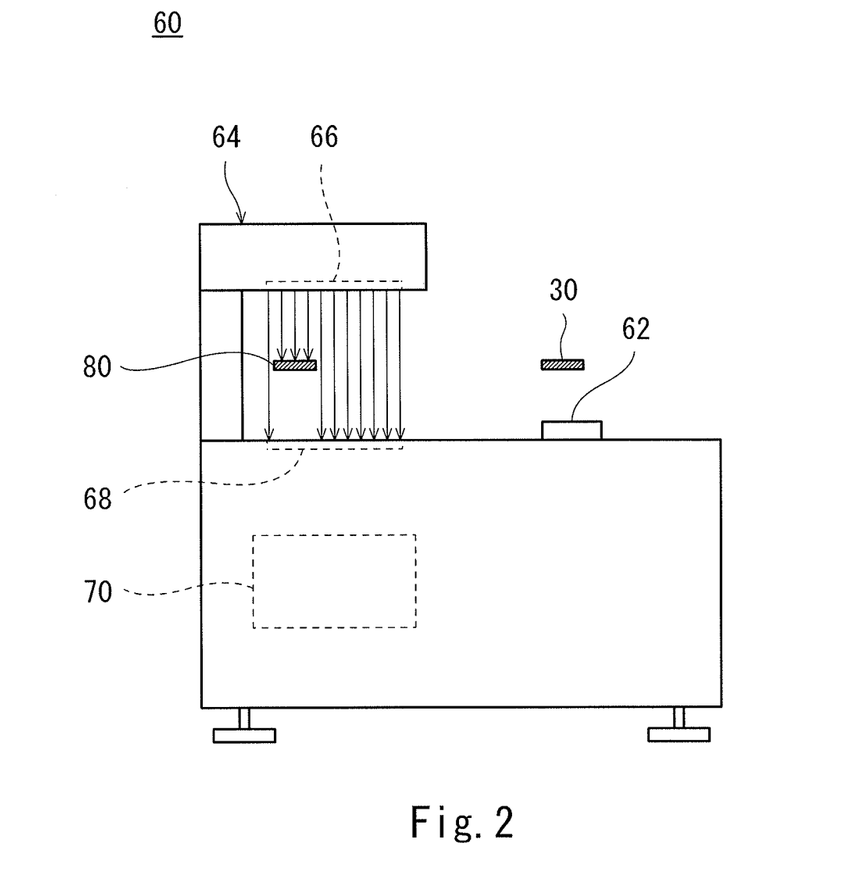
FIG. 2 is a side view showing a case where a prealigner prepared in the first step of the robot diagnosing method according to the embodiment of the present invention detects a position of a detected portion.
Figure 3:
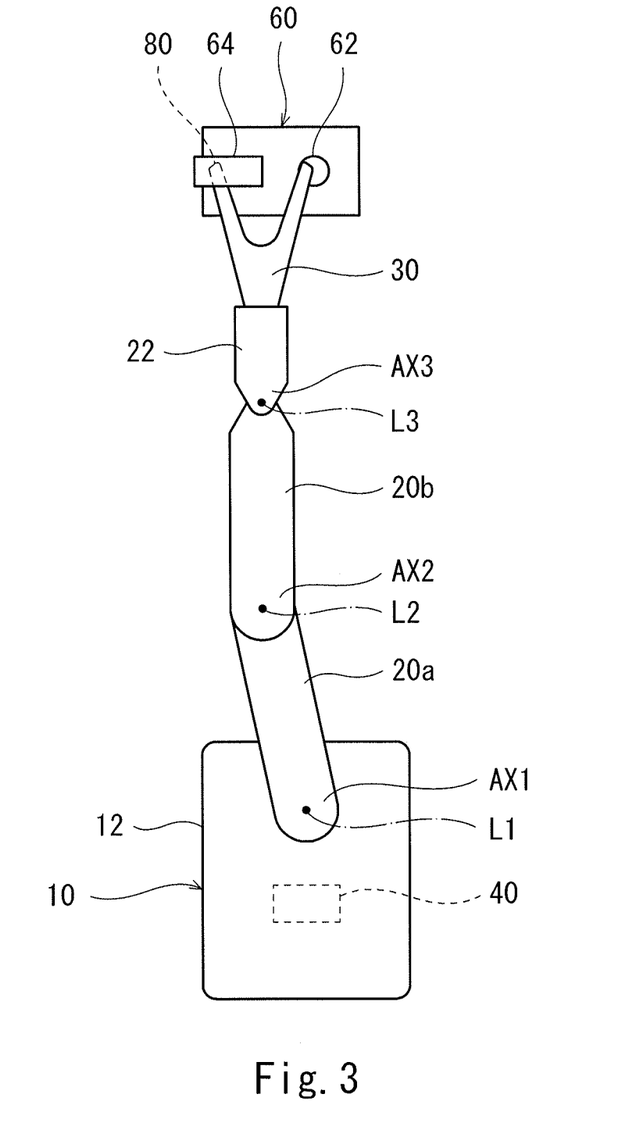
FIG. 3 is a schematic diagram for explaining second and third steps of the robot diagnosing method according to the embodiment of the present invention.
Figure 4:
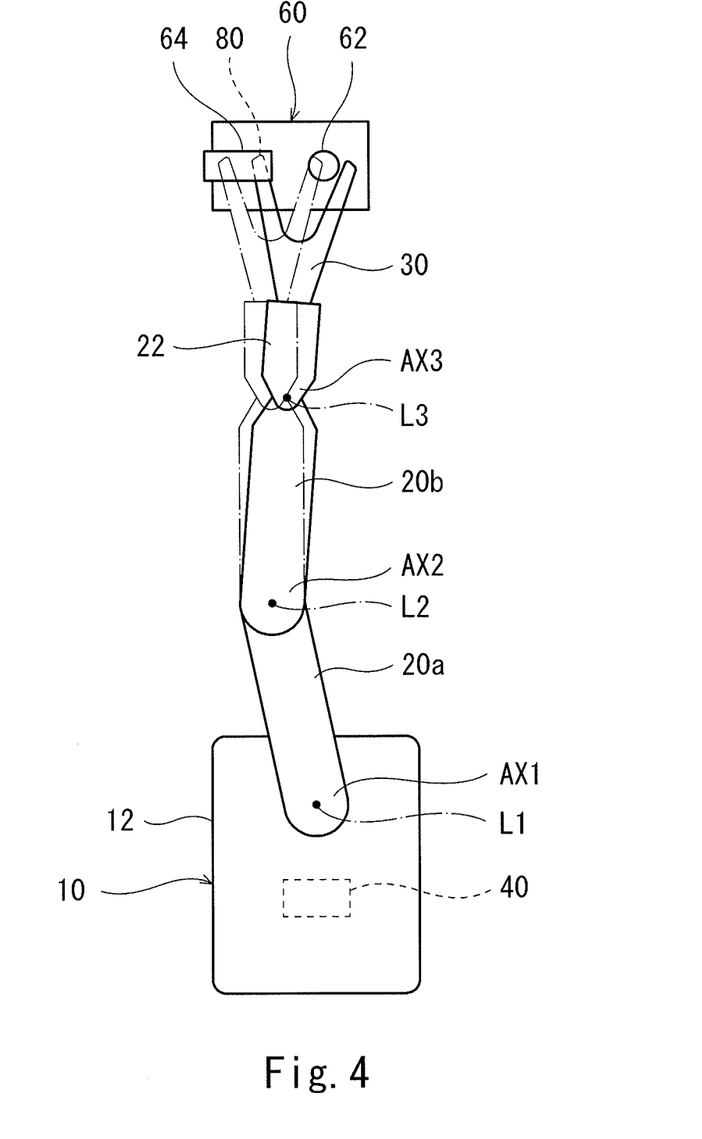
FIG. 4 is a schematic diagram for explaining fourth and fifth steps of the robot diagnosing method according to the embodiment of the present invention.
Figure 5A:
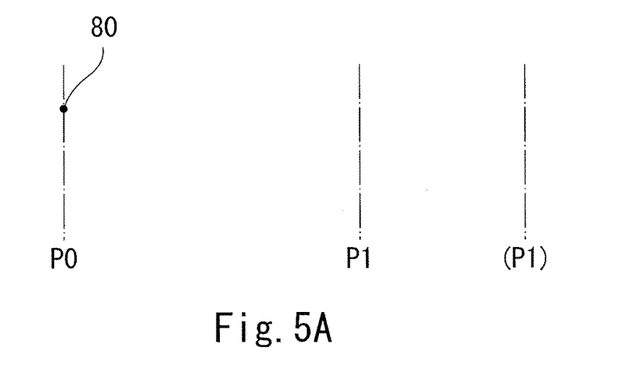
FIGS. 5A to 5C are schematic diagrams for explaining a sixth step of the robot diagnosing method according to the embodiment of the present invention.
Figure 5B:
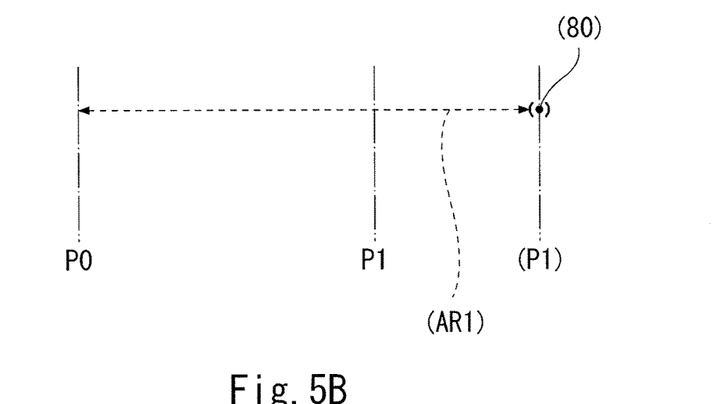
Figure 5C:
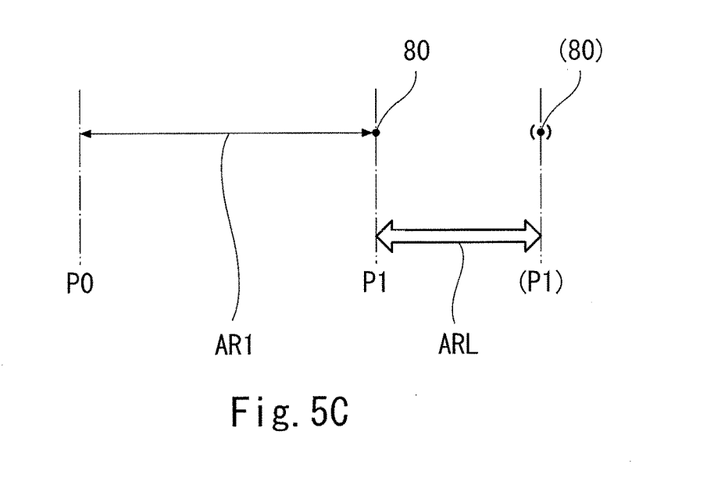

FIG. 1 is a schematic diagram for explaining a first step of the robot diagnosing method of the embodiment of the present invention. FIG. 2 is a side view showing a case where a prealigner prepared in the first step detects a position of a detected portion. FIG. 3 is a schematic diagram for explaining second and third steps of the robot diagnosing method. FIG. 4 is a schematic diagram for explaining fourth and fifth steps of the robot diagnosing method. FIGS. 5A to 5C are schematic diagrams for explaining a sixth step of the robot diagnosing method.

The robot diagnosing method according to the embodiment of the present invention detects a deviation amount caused by a lost motion in a semiconductor manufacturing robot 10 (hereinafter simply referred to as "robot 10") configured to perform operations in a clean room that is a semiconductor manufacturing site. It should be noted that the "deviation amount caused by a lost motion" widely denotes a deviation amount from an ideal motion of the robot. The "lost motion" is caused by backlash, torsion, or the like at each axis of a robot arm, but is not limited to this.

First Step

First, as shown in FIG. 1, performed is the first step of preparing the robot 10 and a line sensor 64 in the clean room that is the semiconductor manufacturing site. In the present embodiment, the line sensor 64 is included in a prealigner 60 configured to detect a center position of a semiconductor wafer (not shown) as a work.

The robot 10 includes: a robot arm 20 including a plurality of joint portions AX including a below-described joint portion AX2 (first joint portion); an end effector 30 attached to the robot arm 20; and a robot control portion 40 configured to control the robot arm 20 and the end effector 30. The robot 10 according to the present embodiment is a so-called horizontal articulated three-axis robot and includes three joint portions (a joint portion AX1, the joint portion AX2 (first joint portion), and a joint portion AX3). The robot 10 further includes a base 12 and a lifting shaft (not shown) provided on an upper surface of the base 12 and extendable in an upward/downward direction. The lifting shaft is configured to be extendable by, for example, an air cylinder (not shown). The robot arm 20 is attached to an upper end portion of the lifting shaft.

The robot arm 20 includes a first arm 20a, a second arm 20b, and a wrist portion 22, each of which is constituted by an elongated member extending in a horizontal direction.

The first arm 20a includes one longitudinal end portion attached to the lifting shaft so as to be rotatable around a vertical axis L1. With this, the joint portion AX1 is configured. The first arm 20a is configured to be rotatable by an electric motor (not shown). The second arm 20b is attached to the other longitudinal end portion of the first arm 20a. The second arm 20b includes one longitudinal end portion attached to the first arm 20a so as to be rotatable around a vertical axis L2. With this, the joint portion AX2 (first joint portion) is configured. The second arm 20b is configured to be rotatable by an electric motor (not shown).

The wrist portion 22 is attached to the other longitudinal end portion of the second arm 20b so as to be rotatable around a vertical axis L3. With this, the joint portion AX3 is configured. The wrist portion 22 is configured to be rotatable by an electric motor (not shown).

A tip end of the end effector 30 is divided into two parts and is configured to have a Y shape in a plan view. A base end portion of the end effector 30 is fixed to a tip end of the wrist portion 22.

Upward and downward movements of the lifting shaft and rotations of the first arm 20a, the second arm 20b, and the wrist portion 22 are controlled by the robot control portion 40.

A specific configuration of the robot control portion 40 is not especially limited and may be realized such that, for example, a publicly known processor (CPU or the like) operates in accordance with a program stored in a storage portion (memory).

As shown in FIG. 2, the prealigner 60 includes: a turn table 62 on which the semiconductor wafer (not shown) as the work is placed; a driving portion (not shown) configured to rotate the turn table 62; and the line sensor 64 configured to detect an outer edge portion of the semiconductor wafer, which is being rotated by the driving portion, to detect a center position of the semiconductor wafer. In the robot diagnosing method according to the present embodiment, the line sensor 64 typically used to detect the center position of the semiconductor wafer as above detects the position of a detected portion 80 of the end effector 30. In the present embodiment, the detected portion 80 is provided at a tip end of the end effector 30.

The line sensor 64 includes: a light emitter 66 configured to emit a light ray; a light receiver 68 configured to receive the light ray emitted from the light emitter 66; and a detecting portion 70 configured to detect the position of the detected portion (for example, the outer edge portion of the semiconductor wafer that is rotating, the detected portion 80 of the end effector 30, or the like) based on a light receiving state of the light receiver 68, the detected portion being inserted between the light emitter 66 and the light receiver 68. The detecting portion 70 may detect the position of the detected portion 80 by regarding the detected portion 80 as existing at a position corresponding to a part of the light ray emitted from the light emitter 66, the part being not received by the light receiver 68 (i.e., the part being shielded). As above, based on the light receiving state of the light receiver 68, the detecting portion 70 can detect the position of the detected portion 80 inserted between the light emitter 66 and the light receiver 68. A specific configuration of the detecting portion 70 is not especially limited and may be realized such that, for example, a publicly known processor (CPU or the like) operates in accordance with a program stored in a storage portion (memory).

As shown by a plurality of down arrows in FIG. 2, the light emitter 66 according to the present embodiment emits the light ray in the upward/downward direction. Specifically, the light emitter 66 according to the present embodiment emits the light ray in a downward direction in FIG. 2 (in FIGS. 1, 3, and 4, in a direction from a front paper surface to a rear paper surface). The light receiver 68 arranged under the light emitter 66 as shown in FIG. 2 (in FIGS. 1, 3, and 4, the light receiver 68 is arranged at a rear paper surface side of the light emitter 66) receives the light ray.

The light ray emitted from the light emitter 66 according to the present embodiment has a band shape. Specifically, the light ray according to the present embodiment has the band shape spreading in (i) a width direction along a leftward/rightward direction in FIG. 2, (ii) a height direction along the upward/downward direction in FIG. 2 and perpendicular to the width direction, and (iii) a thickness direction along a direction connecting the front and rear paper surfaces of FIG. 2 and perpendicular to both the width direction and the height direction. It should be noted that the width direction of the light ray coincides with a radial direction of the semiconductor wafer placed on the turn table 62.

Second Step

Next, performed is the second step of inserting the detected portion 80 of the end effector 30 between the light emitter 66 and the light receiver 68. This state is shown in FIG. 3.

Third Step

Further, after the second step is performed (i.e., in the state shown in FIG. 3), performed is the third step of detecting the position of the detected portion 80 of the end effector 30 by the line sensor 64.

Fourth Step

Then, after the third step is performed, performed is the fourth step of rotating the joint portion AX2 (first joint portion) in a first direction (i.e., in a rightward direction (clockwise direction) in plan views shown in FIGS. 3 and 4) by a predetermined angle based on a command value from the robot control portion 40 while maintaining a state where the detected portion 80 of the end effector 30 is being inserted between the light emitter 66 and the light receiver 68. This state is shown in FIG. 4.

Fifth Step

Further, after the fourth step is performed, performed is the fifth step of detecting the position of the detected portion 80 of the end effector 30 again by the line sensor 64.

Sixth Step

Finally, performed is the sixth step of detecting the deviation amount caused by the lost motion at the joint portion AX2 based on (i) the position of the detected portion (80) based on the position of the detected portion 80 detected in the third step and a command value (AR1) from the robot control portion 40 in the fourth step and (ii) the position of the detected portion 80 detected in the fifth step. The sixth step will be explained in detail based on FIGS. 5A to 5C.

A state of the detected portion 80 in the third step is shown in FIG. 5A. Specifically, in FIG. 5A, the position of the detected portion 80 detected in the third step is shown by "•". As shown in FIG. 5A, the position "•" of the detected portion 80 detected in the third step is located at a position P0.

A state of the detected portion 80 in the fourth step is shown in FIG. 5B. Specifically, in FIG. 5B, an ideal movement distance of the detected portion 80 based on the command value from the robot control portion 40 in the fourth step is shown by a broken line arrow (AR1). Further, in FIG. 5B, the position of the detected portion (80) based on the command value (AR1) from the robot control portion 40 in the fourth step is shown by "(•)". As shown in FIG. 5B, the position "(•)" is located at a position (P1).

Further, the deviation amount caused by the lost motion detected in the sixth step is shown in FIG. 5C. Specifically, in FIG. 5C, an actual movement distance from the detected portion 80 detected in the third step to the detected portion 80 detected in the fifth step is shown by a solid line arrow AR1. Further, in FIG. 5C, the position of the detected portion 80 detected in the fifth step is shown by "•".

Furthermore, in FIG. 5C, the position of the detected portion (80) based on the command value (AR1) from the robot control portion 40 in the fifth step is shown by "(•)" as with FIG. 5B. As shown in FIG. 5C, the position "•" of the detected portion 80 detected in the fifth step is located at a position P1, and the position "(•)" of the detected portion (80) is located at the position (P1) as explained in FIG. 5B. Then, in FIG. 5C, the deviation amount caused by the lost motion detected based on the positions "(•)" and "•" is shown by an outlined arrow ARL.

As shown in FIG. 5C, the deviation amount ARL caused by the lost motion at the joint portion AX2 can be detected based on (i) the position (P1) of the detected portion (80) based on the position P1 of the detected portion 80 detected in the third step and the command value (AR1) from the robot control portion 40 in the fourth step and (ii) the position P1 of the detected portion 80 detected in the fifth step. In the present embodiment, the deviation amount ARL caused by the lost motion can be detected by, for example, calculating a difference between a length of the broken line arrow (AR1) shown in FIG. 5B and a length of the solid line arrow AR1 shown in FIG. 5C.

Effects

The robot diagnosing method according to the present embodiment can detect the deviation amount ARL caused by the lost motion at the joint portion AX2 (first joint portion) based on (i) the position (P1) of the detected portion (80) based on the position P1 of the detected portion 80 detected in the third step and the command value (AR1) from the robot control portion 40 in the fourth step and (ii) the position P1 of the detected portion 80 detected in the fifth step. As a result, the robot diagnosing method according to the present embodiment can detect, by a simple procedure, the deviation amount caused by the lost motion.

In the present embodiment, the first direction in which the joint portion AX2 (first joint portion) rotates in the fourth step is opposite to a direction in which the joint portion AX2 rotates immediately before detecting the detected portion 80 in the third step. With this, for example, the maximum deviation amount caused by backlash at the joint portion AX2 can be accurately detected. Therefore, the deviation amount caused by the lost motion can be accurately detected.

Further, in the present embodiment, the robot 10 is the semiconductor manufacturing robot configured to perform operations in the clean room that is the semiconductor manufacturing site, and the robot 10 and the line sensor 64 are prepared in the clean room in the first step. Therefore, the deviation amount caused by the lost motion can be detected without taking outside the robot 10 configured to perform operations in the clean room that is the semiconductor manufacturing site. With this, it becomes unnecessary to perform, for example, a cleaning operation of the robot 10, the cleaning operation being necessary when the robot 10 is taken outside the clean room, the deviation amount is detected, and the robot 10 is then returned to the clean room. As a result, the effects of the present invention can be made significant in the clean room that is the semiconductor manufacturing site.

Further, in the present embodiment, the line sensor 64 is included in the prealigner 60 configured to detect the center position of the work (such as the semiconductor wafer) subjected to the operation of the robot 10 in the clean room. With this, the deviation amount caused by the lost motion can be detected by using the prealigner 60 provided in advance in the clean room that is the semiconductor manufacturing site. As a result, for example, an introduction cost and an installation space can be reduced.

Modified Examples

The above embodiment has explained a case where the robot 10 and the line sensor 64 are prepared in the clean room that is the semiconductor manufacturing site. However, the above embodiment is not limited to this. To be specific, the robot 10 and the line sensor 64 may be prepared at a different place. In such a case, the work may be a work other than the semiconductor wafer W.

The above embodiment has explained a case where the line sensor 64 is included in the prealigner 60 configured to detect the center position of the semiconductor wafer. However, the above embodiment is not limited to this. To be specific, the line sensor 64 may be configured as a single device not including the turn table 62, the driving portion configured to rotate the semiconductor wafer, or the like.

The above embodiment has explained a case where the light ray emitted from the light emitter 66 has the band shape. However, the above embodiment is not limited to this. For example, the light ray emitted from the light emitter 66 may be constituted by at least two linear light rays emitted so as to extend in the upward/downward direction with a predetermined interval between the two light rays.

The above embodiment has explained a case where the light emitter 66 emits the light ray in the upward/downward direction (to be specific, a substantially vertical direction). However, the light ray may be emitted in a different direction as long as the light ray can be shielded by the detected portion 80 of the end effector 30.

The above embodiment has explained a case of detecting the deviation amount caused by the lost motion at the joint portion AX2. However, the deviation amount caused by the lost motion at the joint portion AX1 or the joint portion AX3 can also be detected by the same procedure as above. Further, the present invention is also applicable to robots including one axis, two axes, or four or more axes.

From the foregoing explanation, many modifications and other embodiments of the present invention are obvious to one skilled in the art. Therefore, the foregoing explanation should be interpreted only as an example and is provided for the purpose of teaching the best mode for carrying out the present invention to one skilled in the art. The structures and/or functional details may be substantially modified within the scope of the present invention.

What is claimed is:

1. A robot diagnosing method of detecting a deviation amount caused by a lost motion,
the robot diagnosing method comprising:
a first step of preparing a robot and a line sensor,
the robot including
a robot arm including one or a plurality of joint portions including a first joint portion,
an end effector attached to the robot arm, and
a robot control portion configured to control the robot arm and the end effector, the line sensor including
a light emitter configured to emit a light ray,
a light receiver configured to receive the light ray emitted from the light emitter, and
a detecting portion configured to detect a position of a detected portion based on a light receiving state of the light receiver, the detected portion being inserted between the light emitter and the light receiver;
a second step of inserting the detected portion of the end effector between the light emitter and the light receiver;
a third step of, after the second step is performed, detecting the position of the detected portion by the line sensor;
a fourth step of, after the third step is performed, rotating the first joint portion in a first direction by a predetermined angle based on a command value from the robot control portion while maintaining a state where the detected portion is being inserted between the light emitter and the light receiver;
a fifth step of, after the fourth step is performed, detecting the position of the detected portion again by the line sensor; and
a sixth step of detecting the deviation amount caused by the lost motion at the first joint portion based on (i) the position of the detected portion based on the position of the detected portion detected in the third step and the command value from the robot control portion in the fourth step and (ii) the position of the detected portion detected in the fifth step.

2. The robot diagnosing method according to claim 1, wherein the first direction in which the first joint portion rotates in the fourth step is opposite to a direction in which the first joint portion rotates immediately before detecting the detected portion in the third step.

3. The robot diagnosing method according to claim 1 or 2, wherein the light ray emitted from the light emitter has a band shape.

4. The robot diagnosing method according to any one of claims 1 to 3, wherein the light emitter emits the light ray in an upward/downward direction.

5. The robot diagnosing method according to any one of claims 1 to 4, wherein:
the robot is a semiconductor manufacturing robot configured to perform an operation in a clean room that is a semiconductor manufacturing site; and
in the first step, the robot and the line sensor are prepared in the clean room.

6. The robot diagnosing method according to claim 5, wherein the line sensor is included in a prealigner configured to detect a center position of a work subjected to the operation of the robot in the clean room.

7. The robot diagnosing method according to claim 6, wherein the work is a semiconductor wafer.

\* \* \* \* \*